United States Patent [19]
Kawamura et al.

[11] Patent Number: 6,005,822
[45] Date of Patent: Dec. 21, 1999

[54] BANK SELECTABLE Y-DECODER CIRCUIT AND METHOD OF OPERATION

[75] Inventors: Patrick J. Kawamura, Richardson; Jeffrey E. Koelling, Dallas, both of Tex.

[73] Assignee: Texas Instruments Incorporated, Dallas, Tex.

[21] Appl. No.: 09/209,375

[22] Filed: Dec. 10, 1998

[51] Int. Cl.⁶ ................................................ G11C 8/00
[52] U.S. Cl. ............................. 365/230.06; 365/230.03
[58] Field of Search ..................... 365/230.06, 230.03, 365/238.5

[56] References Cited

U.S. PATENT DOCUMENTS

| | | | |
|---|---|---|---|
| 5,483,497 | 1/1996 | Mochizuki et al. | 365/230.03 |
| 5,579,280 | 11/1996 | Son et al. | 365/230.03 |
| 5,596,543 | 1/1997 | Sakui et al. | 365/230.06 |
| 5,802,006 | 9/1998 | Ohta et al. | 365/230.06 |

*Primary Examiner*—Son T. Dinh
*Attorney, Agent, or Firm*—Robby T. Holland; Carlton H. Hoel; Richard L. Donaldson

[57] ABSTRACT

Bank selectable Y-decoder circuit (24) generates a plurality of Y-select signals (60, 62, 64, 66) for addressing columns of a plurality of memory banks (12, 14) in a memory array (10) and includes a high-order column factors decode circuit (34) for receiving a plurality of column factor signals. A first low-order column factor circuit (30) generates a first set of Y-select signals (60, 62) for addressing at least one column of a first set of memory banks (12). A second low-order column factors circuit (32) generates a second set of Y-select signals (64, 66) for addressing at least one column of a second set of memory banks (14). The result is a Y-decoder circuit (24) that consumes less silicon die area, without a reduction in circuit performance.

18 Claims, 3 Drawing Sheets

BANK SELECTABLE Y-DECODER CIRCUIT AND METHOD OF OPERATION

TECHNICAL FIELD OF THE INVENTION

The present invention relates to memory circuits and methods of operation of such circuits and, more particularly, to a bank selectable shared Y-decoder circuit and method of operation that provides rapid Y-select activation and requires only a reduced layout area relative to the area which known Y-decoder circuits require.

BACKGROUND OF THE INVENTION

Multiple bank memory circuits call for new and innovative solutions to maximize device performance while minimizing chip size. In attempting to meet this demand, circuit designers have proposed numerous alternatives to the standard synchronous DRAM ("SDRAMs") architecture. Unfortunately, meeting the higher density has proven mutually exclusive with meeting the higher speed requirements. Circuitry to accelerate data flow tends to add area to the memory device. This may be due to increased parallelism where more memory bits are accessed per access. Also, increased area may come from using complex sequences of accelerated data flows in employing a "pipeline" scheme where data is sequentially transmitted down a logically segmented data path.

The area penalty associated with these techniques prevent their unequivocal acceptance, because these penalties directly translate into higher device costs and lower profit margins. Consequently, demand still remains for high speed and density memory device that can compete with the standard asynchronous DRAMs in terms of device size and circuit complexity.

One particular problem with more dense circuits that the present invention addresses relates to the row and column path complexities and size increases that occur as a memory array is partitioned into banks. The row path circuit must latch the wordline for each activated bank, with each bank demanding its own Y-decoder circuit, which increases the device size and affects device performance. For example, a four-bank 256 MB SDRAM requires row address latches for each of four banks in order to hold the wordline state and four Y-decoder banks to complete the column path. This increased complexity consumes circuit area on integrated circuits and generally increases the complexity of the synchronous DRAM.

One of the significant consumers of circuit area is the Y-decoder circuit for transforming column factor signals into Y-select signals for accessing cells in a memory array. If it were possible to reduce the space consumed by the Y-decoder circuitry, while not increasing the access time to the respective memory cells, a significant chip area reduction would result. This is because Y-decoder circuits, while often small in and of itself, permeates complex memory array circuits. A percentage decrease in each of these circuits could result in a decrease in the area for the memory array circuit. No known architecture, however, effectively reduces the Y-decoder circuit space, without compromising important memory array circuit performance characteristics. In fact, no known practical Y-decoder circuit provides the combination of fast Y-select activation while permitting a reduced layout area.

SUMMARY OF THE INVENTION

There is a need, therefore, for a Y-decoder circuit that provides fast Y-select activation and permits reduced layout area to overcome the limitations of known Y-decoder circuits.

The present invention, accordingly, provides a bank selectable Y-decoder circuit for generating a plurality of Y-select signals that address columns of a plurality of memory banks in a memory array. The Y-decoder circuit includes a low and high order column factor signal decoding circuits for translating a plurality of factor signals into a plurality of Y-select signals. The plurality of column factors include a first and second subsets of low-order column factors along with a single set of high-order column factors. Activation of the first subset of low-order column factors associated with the first memory bank coupled with the activation of the high-order column factors generates a first subset of Y-selects to address the first set of memory banks. Activation of the second subset of low-order column factors associated with the second memory bank coupled with the activation of the same high-order column factors generates a second subset of Y-selects to address the second set of memory banks.

The result is a single set of high-order column factors is used in conjunction with two subsets of low-order column factors to activate the appropriate Y-select signal associated with one of the two subsets of low-order column factors. Because one set of high-order column factor lines is used with at least two sets of low-order column factor lines in the Y-decoder circuit to access at least two memory banks, the present invention requires less column factor routing layout area.

According to another aspect of the present invention, the Y-decoder circuit and method of operation provides high speed Y-select activation for multiple bit burst read and write capabilities for high speed memory devices such as synchronous DRAMs.

The Y-decoder circuit permits pulsing of the low-order column factor signals while holding the high-order column factor signals static over a multiple bit burst read and write operation. The low-order column factor signals connect to the input terminal of CMOS pass gate devices in the Y-decoder circuit while the high-order factors connect to the gate terminals of NAND gates to resolve which Y-select to activate over the array. This scheme is advantageous for high-speed operation of the Y-select signals since the low-order column factors are connected to the low capacitance source and drain terminals of the CMOS pass gate device. The reduced capacitance on the low-order column factors permit rapid switching of the low-order column factor signals for high-speed array access. The physical dimension of the Y-decoder may be made small because the low-order column factors share the high-order column factor decoder circuitry between two array banks.

A technical advantage that the present invention provides is the ability to quickly pulse the low-order column factors while maintaining constant the high-order factors. The rapid pulsing of the low-order column factor signal translate to faster activation of the Y-select line for high-speed data access. Keeping the high-order column factor states static over multiple Y-select access cycles also reduces current usage. Sharing the high-order column factors between two banks where only the low-order column factors are bank specific also reduces the Y-decoder circuit size.

BRIEF DESCRIPTION OF THE DRAWINGS

For a more complete understanding of the present invention and the advantages thereof, reference is now made to the following description which is to be taken in conjunction with the accompanying drawings in which like reference numerals indicate like features and wherein.

DETAILED DESCRIPTION OF THE INVENTION

Preferred embodiments of the present invention are illustrated in the FIGUREs wherein like numerals are used to refer to like and corresponding parts of the various drawings.

Figure 1:
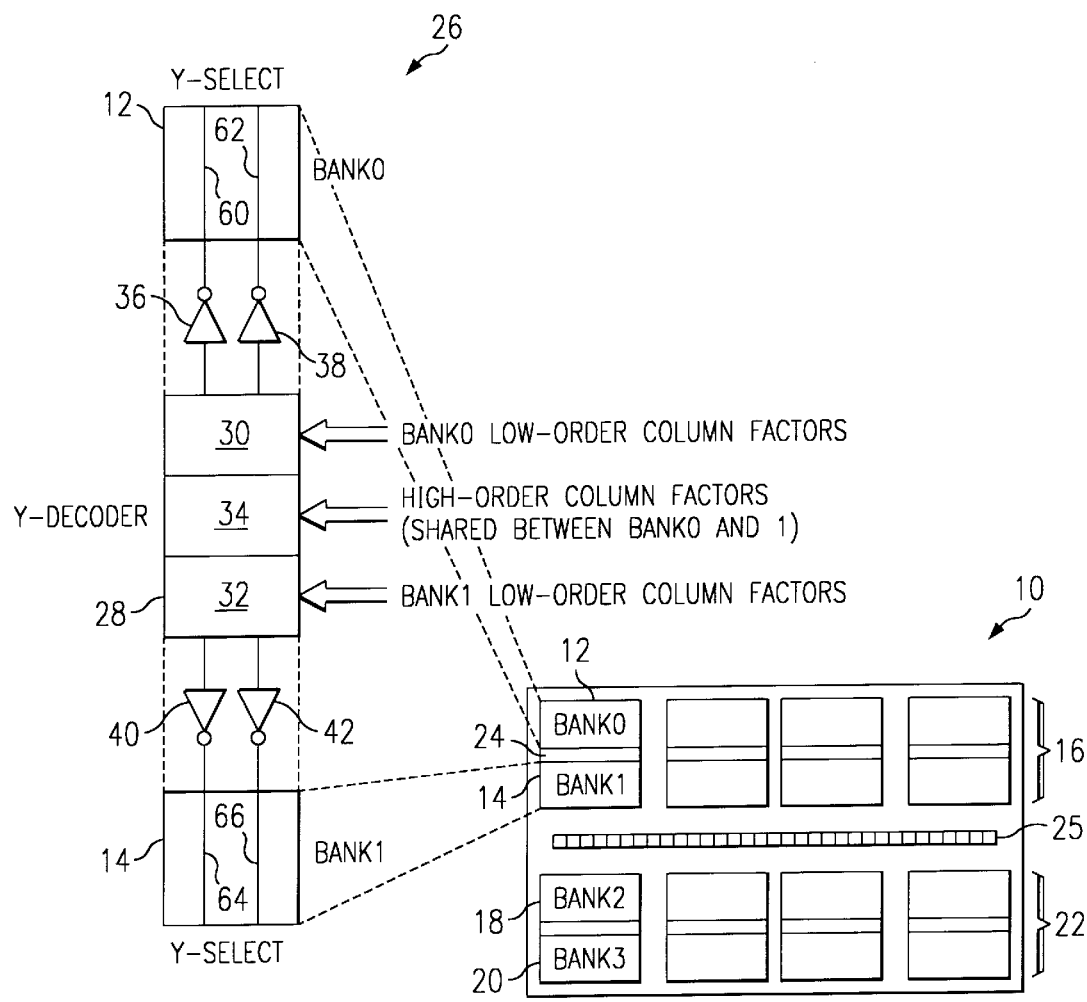
FIG. 1 Provides a conceptual illustration of one embodiment of the present invention.

The present invention provides a Y-decoder circuit that receives column addresses from a source external to the chip, for example, and generates Y-select signals that feed into sense amp banks for selecting data bits in associated memory banks. Illustrating this concept, FIG. 1 shows a conceptual block diagram of the bank selectable shared Y-decoder for use in a 256 MB design formed according to the teachings of the present invention. In FIG. 1, 256 MB chip 10 includes memory bank0 12 and bank1 14 in upper portion 16. Memory bank2 18 and bank3 20 form part of lower portion 22. Y-decoder circuit 24 is positioned between two memory banks, bankO 24 and bank1 14. Pads 25 provide connections for external circuitry to access chip 10.

Magnified circuit segment 26 shows in more detail the circuitry of bank0 12 and bank1 14 that are associated with circuit segment 28 of Y-decoder circuitry 24. Circuit segment 28 includes bank0 low-order column factors circuit 30 and bank1 low-order column factors circuit 32 associated with high-order column factors circuit 34. Output from bank0 low-order column factors circuit 30 goes to inverters 36 and 38, which invert the output of bank0 low-order column factors circuit 30 and provide these signals to bank0 12. Output from bank1 low order column factors circuit 32 gives into inverters 40 and 42, which invert the output of low-order column factors circuit 32 and provide these signals to bank1 14.

Bank selectable shared Y-decoder circuit 24 of the present invention, therefore, resides between two memory banks, such as bank0 12 and bank1 14. Low-order column factor circuit 30 controls the Y-select activation of the bank0 12, whereas low-order column factors circuit 32 activates the Y-select in bank1 14. High-order column factor circuit 34 is enabled when accessing the Y-select in either bank0 12 or bank1 14.

The illustrated embodiment of the present invention provides four banks of memory, with each one of the banks having a particular size and forming an array of memory banks. It may be possible, however, to have an eight-bank, or other configurations. The Y-selects are unique for each bank. So, with Y-decoder circuitry 24 positioned between bank2 18 and bank3 20, for example, an shared Y-decoder provides the desired Y-select signals to each bank.

Figure 2:
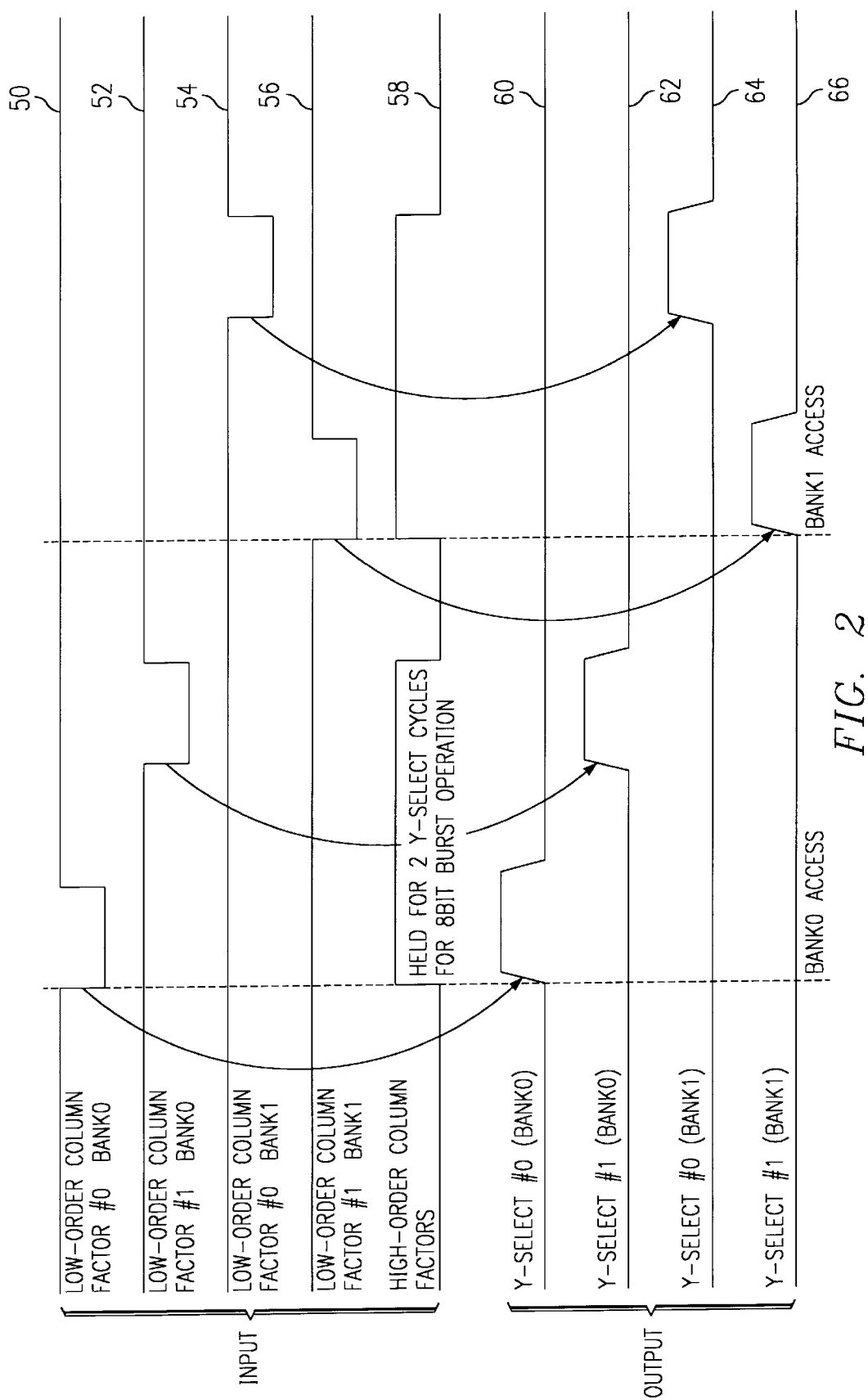
FIG. 2 shows timing diagrams corresponding to the embodiment of FIG. 1.

FIG. 2 shows input and output timing diagrams applicable to the operation of Y-decoder circuitry 24 of the present invention. In particular, timing diagrams 50 and 52 describe the operation of low-order column factors #0 and low-order column factors #1 for bank0 low-order column factors circuit 30. Timing diagrams 54 and 56 describe the operation of low-order column factor #0 and low-order column factor #1 timing for bank1 low-order column factors circuit 32. High-order column factors timing diagram 58 describes the output from high-order column factor circuit 34, showing this signal to be held for two Y-select cycles per bank access for the burst read/write. Y-select can be held for a differing number of cycles based on the burst length and number of prefetched bits.

Output timing diagrams for Y-decoder circuit 24 include Y-select #0 timing diagram 60 for bank0 12 and Y-select #1 timing diagram 62, also from bank0 12. From bank1 14, output timing diagrams include Y-select #0 timing diagram 64 and Y-select #1 timing diagram 66.

As FIG. 2 shows, bank0 low-order column factor #0 pulses low to drive the Y-select #0 output and begins the bank0 12 access. Thereafter, bank0 low-order column factor #1 pulses low to cause Y-select #1 output bank0 to go high. Bank1 14 access begins with low-order column factor #1 pulsing low, causing Y-select #1 to go high. Then, low-order column factor #0 timing diagram 54 pulses low to cause Y-select #0 timing diagram 64 to go high.

Column factors timing diagrams 50, 52, 54, 56, and 58, therefore, are inputs from the column factor circuitry to Y-decoder circuit 24. Y-select timing diagrams are the outputs of Y-decoder circuit 24, or the state of the Y-selects. The correspondence between each of the low-order column factors inputs and the Y-select outputs is indicated by an arrow connecting respective ones of the timing diagrams.

As FIG. 2 shows, high-order column factors combine with low-order column factors to resolve each Y-select. High-order column factor circuit 34 resolves the column factors to the point that only low-order column factors may resolve the yet-decoded signal and determine which Y-select to fire in addressing a given sense amp of the associated memory banks. High-order column factors fire in association with the low-order column factors #0 and #1 which determine which of the two Y-selects will fire in a bank. The sense amp then responds to the Y-select to couple data to the I/O line.

In selecting bank0 12, the low-order column factors circuit 30 fires Y-select #0 60 first and Y-select #1 62 next. On the other hand, it may be possible to fire Y-select #1 62 first and then Y-select #0 60. This would depend on the column address and the type of burst operation, for example, whether an interleave burst or a serial burst mode is being used and the burst length. Either of these modes of operation are compatible with the present invention.

In the preferred synchronous DRAM architecture for implementing the present invention, a prefect and pipeline architecture are used to acquire data from the array at a fast speed. To do this, the Y-selects fire multiple times during a row access cycle. For this reason, the Y-select signals fire, in logical sequence. For example, if Y-select #0 is firing in a specified bank, in order to get the first set of bits to burst in or out, the adjacent Y-select must fire to burst in or out the second set of data in an 8-bit burst for the same bank. For this purpose, the high-order column factors stay static, but only the low-order column factors toggle. As long as the high-order column factors remain static and only low-order column factors move, a small amount of power will be consumed with even a possible increase in speed, since the high-order factors do not reset and get set again.

The pulse width for the low-order column factors is determined by how fast the data can be transmitted between the sense amplifier and the I/O line. This speed is determined by the signal level on the sense amp node and the I/O line. The charge transfer speed of the Y-select transistor in the sense amp and the voltage level of the Y-select also figure into the speed of the Y-select pulse.

The design of the present invention permits routing of the factor lines and power lines over the active devices in the decoder. Accordingly, a factor signal routing channel is not needed, resulting in chip area savings.

Figure 3:
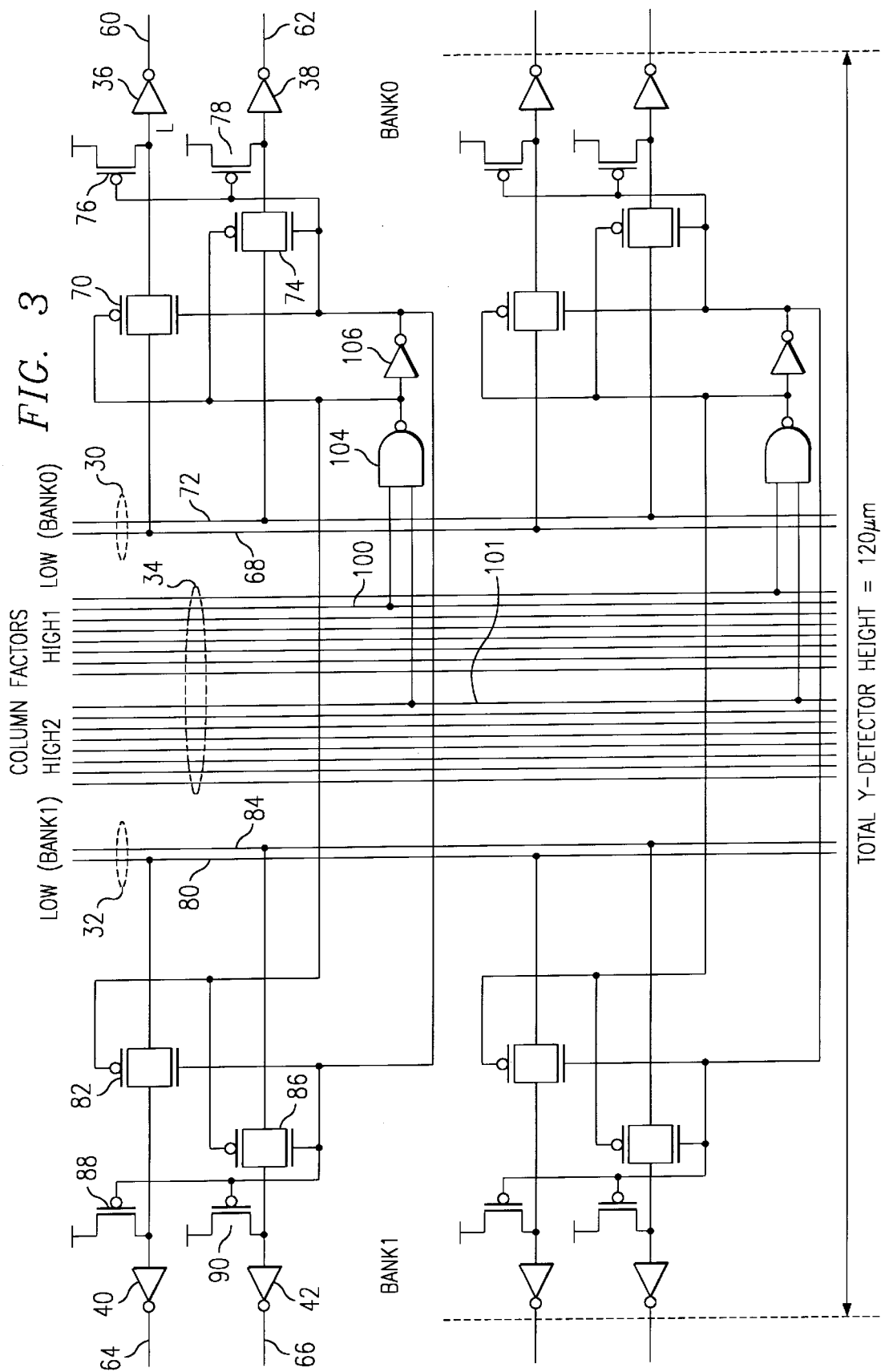
FIG. 3 is a detailed schematic diagram of the Y-decoder circuitry of the present invention.

FIG. 3 shows in more detail two Y-decoder circuit segments 28 similar to that of Y-decoder circuit segment 28 appearing in FIG. 1. The formation of Y-decoder circuit segment 28 may be by a variety of well known integrated circuit fabrication techniques and processes.

With particular reference to FIG. 3, bank0 12 low-order column factors circuit 30 includes line 68 that connects to CMOS pass gate transistor 70. Line 72 of bank0 12 low-order column factors circuit 30 connects to CMOS pass gate transistor 74. Output from CMOS pass gate transistor 70 is controlled by pull-up transistor 76 which controls input to invertor 36. Output from CMOS pass gate transistor 74 is controlled by pull-up transistor 78 which controls input to invertor 38. Pull-up transistors 76 and 78 may be, for example, a PMOS device. Bank1 14 low-order column factors 32 provide inputs including input from line 80 to passgate transistor 82 and from line 84 to passgate transistor 86.

High-order column factors 34 include, for example, line 100 and line 101 that provide inputs to NAND gate 104. Output from NAND-gate 104 goes to CMOS pass gate transistor 70, CMOS pass gate transistor 74, CMOS pass gate transistor 82, and CMOS pass gate transistor 86. In addition, output from NAND-gate 104 goes to inverter 106 for generating an inverted signal. This signal goes to CMOS pass gate transistor 70, CMOS pass gate transistor 74, CMOS pass gate transistor 82, and CMOS pass gate transistor 86 and P-channel pullups. Output from CMOS pass gate transistor 70 goes to inverter 36 which feeds bank0 12 as a Y-select. Bank0 12 also receives Y-select signal from inverter 38 which itself receives input from CMOS pass gate transistor 74. Inverter 40 receives output from CMOS pass gate transistor 82 for bank1 14, as does inverter 42 from CMOS pass gate transistor 86 for bank1 14.

In operation, the Y-decoder circuit 24 of the present invention provides a multi-bit data burst read/write operation. Each Y-select places bits of data on the I/O line and makes possible 1-, 2-, 4-, or 8-bit burst read/write operation. The 16 high-order column factors decode one of 64 addresses and the two low-order column factors decode the column address to 1 of 128 Y-selects. The low-order column factor lines 68 and 72, for example, are active-low for eliminating an extra inverter stage for speed and area reduction. Low-order column factor lines 68 and 72 connect to the low capacitance source/drain terminal of the CMOS pass gate transistors 70 and 74. Accordingly, low-order column factor lines 68 and 72 do not see high gate capacitance loading.

Looking at the first decoder cell, in an example of Y-decoder circuit segment 28, inputs from lines 100 and 101 go to NAND-gate 104. Initially, while the output of the NAND gate is high, the Y-selects are low because the pull-up transistor 76 or 78 is turned on. If these inputs are both high at NAND gate 104, the output from NAND-gate 104 is low. Then, inverter 106 makes this output high, again to turn on both CMOS pass gate transistors 70 and 74. At this time, the low-order column factors are high. With the CMOS pass gate transistors 70 and 74 turned on, the low-order column factors #0 30 go to the inverters 36 and 38. Accordingly, if one of the low-order factor is pulsed low, this produces a high going Y-select pulse at the output of 36 or 38 after it is inverted. For the unaccessed cells, the output of the NAND gate 104 is held high. If the output of NAND gate 104 is high, CMOS pass gates 70 and 74 are turned off; this limits the capacitive loading that the low-order factors sees to that of the source/drain capacitance seen at input of CMOS pass gate transistors 70 and 74.

In operation, therefore, Y-decoder circuit 24 may receive a high order column factor to produce the state of the high-order column factors to access bank0 12 or bank1 14. This causes the output on the two high-order factor lines 100 and 101 to be high. This turns on CMOS pass gate transistors 70, 74 and 82, 86 and disables the pull-up transistors 76, 78 and 88, 90. Initially, since both sets of low-order column factors are all high, the outputs of invertors 36 and 38, 40, 42 are maintained low. Then, one of the two low-order column factors in the selected bank pulses low. The low going pulse produces a high going pulse at the output of the inverting buffer. This signal then goes to the sense amp to access the specific Y addresses of memory. After the data transfer occurs from the sense amp, the low-order column factors reset to high again. This resets the Y-select back to low and turns off the Y-select from bank0 12.

Although the invention has been described in detail herein with reference to the illustrative embodiments, it is to be understood that this description is by way of example only and is not to be construed in a limiting sense. It is to be further understood, therefore, that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. A bank selectable Y-decoder circuit for generating a plurality of Y-select signals for addressing columns of a plurality of memory banks in a memory array, comprising:
   a column factors circuit comprising at least one low-order column factor signal decoding circuit and at least one high-order column factor decoding circuits for receiving a plurality of column factor signals and generating therefrom a plurality of Y-select signals for addressing a plurality of memory banks and;
   said Y-decoder circuit comprising circuit for using a single set of high-order column factors in association with at least two subsets of low-order column factors for activating intended Y-select signal lines associated with one of said at least two low-order column factors.

2. The bank selectable Y-decoder circuit of claim 1, wherein column factor circuit further comprises a set of high-order column factor lines and at least two low-order column factor lines for accessing at least two memory banks.

3. The bank selectable Y-decoder circuit of claim 1, wherein said column factors circuitry further comprises a CMOS pass gate transistor for controlling the generation of said Y-select signals while minimizing capacitive loading in said bank selectable Y-decoder circuit.

4. The bank selectable Y-decoder circuit of claim 1, wherein said column factors circuit further comprises circuitry for operating in a synchronous RAM serial data burst mode.

5. The bank selectable Y-decoder circuit of claim 1, wherein said column factor circuit further comprises circuitry for operating in a synchronous RAM interleave data burst mode.

6. The bank selectable Y-decoder circuit of claim 1, wherein said column factors circuit connect to a logical NAND circuit for generating a logical NAND output in controlling the generation said plurality of Y-select signals.

7. A method for generating a plurality of Y-select signals for addressing columns of a plurality of memory banks in a memory array, comprising the steps of:
   receiving a plurality of column factor signals for addressing a plurality of memory banks and generating therefrom a plurality of Y-select signals using a column factor circuit comprising at least one low-order column factor signal decoding circuit and at least one high-order decoding column factor circuit; and activating an intended Y-select signal associated with one of said at least two low-order column factors using an activation circuit within said Y-decoder circuit.

8. The method of claim 7, further comprising the step of accessing at least two memory banks associated with said bank selectable Y-decoder circuit using a circuit comprising a set of high-order column factor lines and at least two low-order column factor lines.

9. The method of claim 7, pulsing low the column factors circuit for sequentially and alternatingly generating said plurality of Y-select signals.

10. The method of claim 7, further comprising the step of controlling the generation of said Y-select signals while minimizing capacitive loading in said Y-decoder circuit using a CMOS pass gate transistor.

11. The method of claim 7, further comprising the step of generating said high-order column factors, said low-order column factors in a synchronous RAM serial data burst mode.

12. The method of claim 7, further comprising the step of generating said high-order column factors, said low-order column factors in a synchronous RAM interleave burst mode.

13. The method of claim 7, further comprising the step of generating a logical NAND output in controlling the generation of said plurality of Y-select signal.

14. A method of forming bank selectable Y-decoder circuit for generating a plurality of Y-select signals for addressing columns of a plurality of memory banks in a memory array, comprising the steps of:

forming a column factors circuit comprising at least one low-order column factor signal decoding circuit and at least one high-order column factor decoding circuit for receiving a plurality of high-order column factor signals and generating therefrom a plurality of Y-select signals for addressing a plurality of memory banks and;

forming said Y-decoder circuit to further comprise circuitry for using a single set of high-order column factors in association with at least two subsets of low-order column factors for activating an intended Y-select signal lines associated with one of said at least two low-order column factors.

15. The bank selectable Y-decoder circuit forming method of claim 14, further comprising the step of forming said column factor circuit to further comprise column factors circuit to a set of high-order column factor lines and at least two low-order column factor lines for accessing at least two memory banks.

16. The bank selectable Y-decoder circuit forming method of claim 14, further comprising the step of forming said column factors circuit to further comprise a CMOS pass gate transistor for controlling the generation of said Y-select signals while minimizing capacitive loading bank selectable Y-decoder circuit.

17. The bank selectable Y-decoder circuit forming method of claim 14, further comprising the step of forming said column factors circuit to further comprise circuitry for operating in a RAM serial burst mode.

18. The bank selectable Y-decoder circuit forming method of claim 14, further comprising the step of forming said column factors circuit to further comprise circuitry for operating in an interleave burst mode.

* * * * *

UNITED STATES PATENT AND TRADEMARK OFFICE
CERTIFICATE OF CORRECTION

PATENT NO: 6,005,822
DATED: 12/21/1999
INVENTOR(S): J. Patrick Kawamura, Jeffrey E. Koelling It is certified that an error appears in the above-identified patent and that said Letters Patent hereby corrected as shown below:

On the face of the patent in column 1, please insert the following:

"Inventors"

-- [75] J. Patrick Kawamura, Jeffrey E. Koelling --

"Related U.S. Application Data"

-- [60] Provisional application No. 60/069,819 Dec. 16, 1997 --

Signed and Sealed this

Twenty-ninth Day of August, 2000

Attest:

Attesting Officer

Q. TODD DICKINSON

Director of Patents and Trademarks